(12) United States Patent
Chung et al.

(10) Patent No.: US 8,895,972 B2
(45) Date of Patent: Nov. 25, 2014

(54) DISPLAY DEVICE AND ORGANIC LIGHT EMITTING DISPLAY DEVICE HAVING AUXILIARY ELECTRODE

(71) Applicant: Samsung Display Co., Ltd., Yongin (KR)

(72) Inventors: Jin-Koo Chung, Yongin (KR); Jun-Ho Choi, Yongin (KR); Seong-Min Kim, Yongin (KR)

(73) Assignee: Samsung Display Co., Ltd., Yongin, Gyunggi-Do ( * ) Notice: Subject to any disclaimer, the term of this patent is extended or adjusted under 35 U.S.C. 154(b) by 0 days.

(21) Appl. No.: 13/796,965

(22) Filed: Mar. 12, 2013

(65) Prior Publication Data
US 2014/0145152 A1    May 29, 2014

(30) Foreign Application Priority Data

Nov. 26, 2012   (KR) ................. 10-2012-0134870

(51) Int. Cl.
*H01L 27/32* (2006.01)
*H01L 51/52* (2006.01)

(52) U.S. Cl.
CPC ............. *H01L 27/32* (2013.01); *H01L 51/5228* (2013.01); *H01L 51/5212* (2013.01); *H01L 51/5203* (2013.01); *H01L 27/3206* (2013.01); *H01L 27/3218* (2013.01); *H01L 27/3297* (2013.01)

USPC ................................ 257/40; 257/89; 257/99

(58) Field of Classification Search
CPC .................................................. H01L 27/3297
See application file for complete search history.

(56) References Cited

U.S. PATENT DOCUMENTS

| | | | |
|---|---|---|---|
| 8,008,855 B2 | 8/2011 | Song et al. | |
| 2008/0122351 A1* | 5/2008 | Kitazume | 313/504 |
| 2009/0256470 A1* | 10/2009 | Naono | 313/504 |
| 2011/0241563 A1 | 10/2011 | Kim et al. | |
| 2012/0313099 A1 | 12/2012 | Chung et al. | |
| 2013/0134449 A1* | 5/2013 | Chen et al. | 257/88 |

FOREIGN PATENT DOCUMENTS

| | | |
|---|---|---|
| KR | 10-2010-0030982 | 3/2010 |
| KR | 10-2011-0111747 A | 10/2011 |
| KR | 1020110138787 A | 12/2011 |
| KR | 10-2012-0134464 | 12/2012 |

* cited by examiner

*Primary Examiner* — Stephen W Smoot
(74) *Attorney, Agent, or Firm* — Knobbe Martens Olson & Bear LLP

(57) ABSTRACT

A display device including a substrate; an organic light emission unit, which is arranged on the substrate, wherein light emission regions arranged in a first direction emit light of a same color and light emission regions adjacent to one another from among light emission regions arranged in a second direction crossing the first direction emit light of different colors; a counter electrode, which is arranged to cover at least the light emission regions; and an auxiliary electrode, which is formed on the auxiliary electrode, does not overlap the light emission regions, and extends in the second direction.

23 Claims, 15 Drawing Sheets

DISPLAY DEVICE AND ORGANIC LIGHT EMITTING DISPLAY DEVICE HAVING AUXILIARY ELECTRODE

CROSS-REFERENCE TO RELATED APPLICATIONS

This application claims the benefit of Korean Patent Application No. 10-2012-0134870, filed on Nov. 26, 2012, in the Korean Intellectual Property Office, the disclosures of which are incorporated herein in their entirety by reference.

BACKGROUND

1. Field

The present disclosure relates to a display device and an organic light-emitting display device capable of having large panels.

2. Description of the Related Technology

Recently, display devices have been replaced with portable thin flat panel display devices. Flat panel display devices include light-receiving display devices, such as liquid crystal display (LCD) devices, and light-emitting display devices, such as organic light-emitting display devices and plasma display devices (PDP).

Organic light-emitting display devices are self-emission type display devices that emit light by electrically exciting an organic compound, that can be driven at a low voltage and can be manufactured thin, and that have wide viewing angles and high response speeds. Thus, organic light-emitting display devices are regarded as next-generation display devices.

Recently, many attempts have been made to embody a large display by using organic light-emitting display devices. However, by doing so, a wiring resistance of a common electrode that covers all pixels increases.

SUMMARY

Provided are display devices and organic light-emitting display devices having common electrodes with reduced wiring resistances.

Additional aspects will be set forth in part in the description which follows and, in part, will be apparent from the description, or may be learned by practice of the presented embodiments.

According to an aspect of the present embodiments, a display device includes a substrate; a organic light emission unit, which is arranged on the substrate, wherein light emission regions arranged in a first direction emit light of a same color and light emission regions adjacent to one another from among light emission regions arranged in a second direction crossing the first direction emit light of different colors; a counter electrode, which is arranged to cover at least the light emission regions; and an auxiliary electrode, which is formed on the auxiliary electrode, does not overlap the light emission regions, and extends in the second direction.

The display device further includes non-light emission regions that are arranged between the light emission regions arranged in the first direction, and the auxiliary electrode is arranged in the non-light emission region.

The substrate includes long sides extending in the first direction and short sides extending in the second direction, and the auxiliary electrode extends in the direction in which the short sides extend.

A terminal for applying power to the auxiliary electrode is arranged near to the long side.

The substrate includes long sides extending in the second direction and short sides extending in the first direction, and the auxiliary electrode extends in the direction in which the long sides extend.

A terminal for applying power to the auxiliary electrode is arranged near to the short side.

First sides of the light emission region extending in the first direction are longer than second sides of the light emission region extending in the second direction.

The counter electrode is arranged to be phototransmissive.

The auxiliary electrode includes a metal, such as aluminum or silver, with a low resistance.

The display device further includes an auxiliary layer that is formed at least in the light emission region.

The auxiliary layer is arranged to be phototransmissive.

The auxiliary layer has first side edges, and the auxiliary electrode has second side edges of which side surfaces contact side surfaces of the first side edges.

The auxiliary layer can include 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

Adhesion between the auxiliary electrode and the auxiliary layer is weaker than adhesion between the auxiliary electrode and the counter electrode.

The auxiliary electrode can include Mg or Mg alloy.

A first electrode is formed in correspondence to the light emission region, and the display device further includes a thin-film transistor (TFT) that is electrically connected to the a first electrode.

According to another aspect of the present embodiments, an organic light-emitting display device includes a substrate, which includes a first region; and second regions, which are arranged by interposing the first region therebetween and emit light of a same color; first electrodes arranged in the second regions; second electrodes, which face the first electrodes and are arranged to cover the first region and the second regions; organic light-emitting layers which are interposed between the first electrode and the second electrodes and emit light; and a third electrode, which contacts the second electrode and is arranged in the first region.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
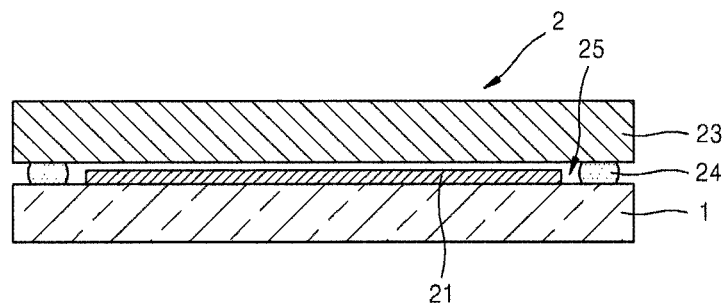
FIGS. 1 and 2 are cross-sectional views illustrating an organic light-emitting display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

The terms used in the present specification are merely used to describe particular embodiments, and are not intended to limit the present embodiments.

An expression used in the singular encompasses the expression of the plural, unless it has a clearly different meaning in the context.

While such terms as "first," "second," etc., may be used to describe various components, such components must not be limited to the above terms. The above terms are used only to distinguish one component from another.

It will also be understood that when a layer is referred to as being "on" another layer or substrate, it can be directly on the other layer or substrate, or intervening layers may also be present.

Hereinafter, the present embodiments will be described in detail by explaining preferred embodiments with reference to the attached drawings. Like reference numerals in the drawings denote like elements.

FIG. 1 is a cross-sectional view illustrating an organic light-emitting display device according to an embodiment.

Referring to FIG. 1, the organic light-emitting display device includes an organic light emission unit 21 formed on a substrate 1, and a sealing substrate 23 sealing the organic light emission unit 21.

The sealing substrate 23 comprises a transparent material so as to allow an image from the organic light emission unit 21 to be realized, and functions to prevent external air and moisture from penetrating into the organic light emission unit 21.

Side edges of the substrate 1 and the sealing substrate 23 are bonded by a sealing member 24, so that a space 25 between the substrate 1 and the sealing substrate 23 is sealed.

In the space 25, an absorbent or a filler may be included.

Figure 2:
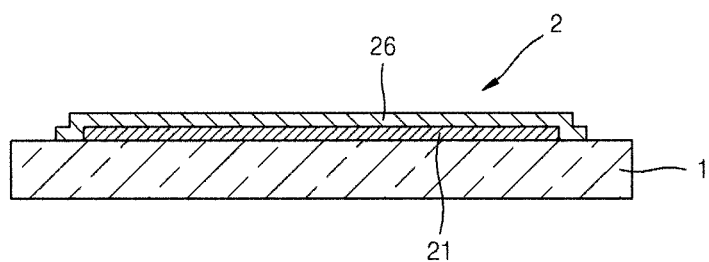

Instead of using the sealing substrate 23, as illustrated in FIG. 2, a thin sealing film 26 may be formed on the organic light emission unit 21 so that the organic light emission unit 21 may be protected from the outside. For example, the sealing film 26 may have a structure in which a layer that comprises an inorganic material including silicon oxide or silicon nitride and a layer that comprises an organic material including epoxy or polyimide are alternately formed. Alternatively, the sealing film 26 may have a structure including a low melting glass, such as tin oxide (SnO). However, the structures of the sealing film 26 are not limited thereto and thus the sealing film 26 may have any sealing structure formed on a transparent thin film.

Figure 3:
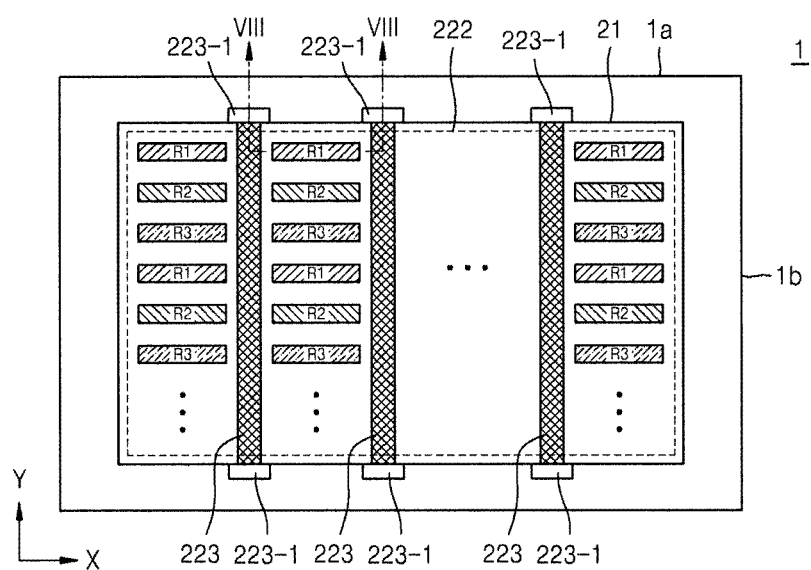
FIG. 3 is a plan view showing an example of an organic light emission unit shown in FIGS. 1 and 2.

FIG. 3 is a plan view showing an example of the organic light emission unit 21 shown in FIGS. 1 and 2. FIG. 3 shows portions of light emission regions R1, R2, and R3 of the organic light emission unit 21 and a portion of an auxiliary electrode 223, where the light emission regions R1, R2, R3 and the auxiliary electrode 223 are further formed in the other portion of the organic light emission unit 21 not shown in FIG. 3 in the same manner as shown in FIG. 3.

Referring to FIG. 3, the light emission regions R1, R2, and R3 are arranged in the light emission unit 21. The light emission regions R1, R2, and R3 are regions in which organic light emission layers are respectively arranged and emit red light, green light, and blue light. However, colors of lights emitted thereby are not limited thereto, and colors of lights emitted thereby may further include white, purple, or orange. Hereinafter, for convenience of explanation, the light emission region emitting red light may also be referred to as a red region R1, the light emission region emitting green light will be referred to as a green region R2, and the light emission region emitting blue light will be referred to as a blue region R3. A row of light emission regions arranged in a first direction X will be referred to as a row, whereas a row of light emission regions arranged in a second direction Y will be referred to as a column.

Referring to FIG. 3, the light emission regions R1 arranged in the first direction X emit light of a same color. Light emission regions adjacent to one another from among the light emission regions R1, R2, and R3 that are arranged in the second direction Y emit lights of different colors. For example, all of the light emission regions in a first row may be red regions R1, all of the light emission regions in a second row may be green regions R2, and all of the light emission regions in a third row may be blue regions R3. Light emission regions on the first through third rows may be repeatedly arranged as light emission regions in fourth through sixth rows. In this case, the red regions R1, the green regions R2, and the blue regions R3 are alternately formed in light emission regions of each row.

A pixel electrode is arranged in correspondence to the respective light emission regions R1, R2, and R3. A pixel-defining layer is formed to cover an outer end portion of the pixel electrode. An opening is formed in the pixel-defining layer to expose a center portion of the pixel electrode, thereby defining a light emission region. An organic layer is formed on a portion of the pixel electrode exposed by the opening, and a counter electrode 222 is formed to cover the organic layer. The counter electrode 222 is a common electrode and is formed on the entire organic light emission unit 21 to completely cover a light emission layer array.

If the organic light-emitting display device of FIGS. 1 and 2 is a top emission type display device which emits light toward a sealing substrate, the counter electrode 222 needs to be phototransmissive. To this end, the counter electrode 222 may include a transparent metal oxide or may be formed as a thin-film by using a metal with low resistance.

However, if the organic light-emitting display device of FIGS. 1 and 2 is a top emission type display device, the counter electrode 222 includes a transparent metal oxide or a metal thin-film. Therefore, if the counter electrode 222 is formed as a common electrode, a surface resistance of the counter electrode 222 increases, and thus a voltage drop may occur. To resolve this problem, the auxiliary electrode 223 is further formed to be electrically connected to the counter electrode 222 according to the present embodiments.

The auxiliary electrode 223 may include a metal with low resistance, e.g., aluminum (Ag), silver (Ag), and/or magnesium (Mg). Furthermore, the auxiliary electrode 223 may be formed to have a thickness greater than that of the counter electrode 222 to reduce surface resistance. The auxiliary electrode 223 may not be formed to overlap the light emission regions R1, R2, and R3 to prevent a reduction of an aperture ratio. Therefore, the auxiliary electrode 223 is formed in non-light emission regions. The non-light emission regions are arranged between the light emission regions arranged in the first direction X. Therefore, the auxiliary electrode 223 has a length extending in the second direction Y. and the auxiliary electrode 223 has a width smaller than or equal to the interval between the light emission regions R1, R2, or R3 of a same color.

It is preferable to form the auxiliary electrode 223 to have a sufficient width for reducing surface resistance. According to the embodiment shown in FIG. 3, the auxiliary electrode 223 may be formed to have the greatest width in a limited space. Detailed description thereof will be given below with reference to FIG. 5.

In FIG. 3, the substrate 1 on which the organic light emission unit 21 is arranged has long sides 1a extending in the first direction X and short sides 1b extending in the second direction Y. Therefore, the auxiliary electrode 223 is arranged to extend in a direction substantially corresponding to the direction in which the short sides 1b of the substrate 1 extend.

Figure 4:
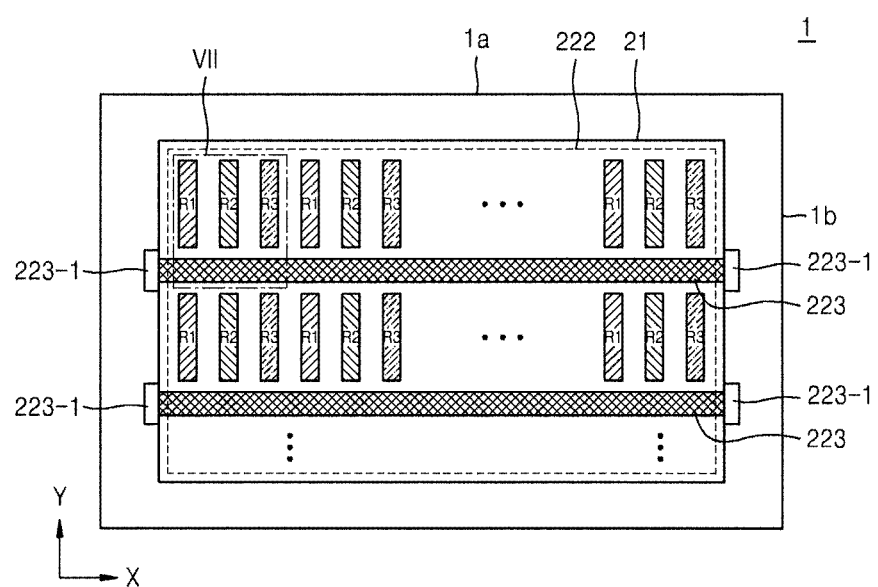
FIG. 4 is a plan view showing another example of the organic light emission unit shown in FIGS. 1 and 2.

FIG. 4 is a plan view showing another example of the organic light emission unit 21 shown in FIGS. 1 and 2. The embodiment shown in FIG. 4 differs from the embodiment shown in FIG. 3 in the arrangement of the light emission regions R1, R2, and R3 and the auxiliary electrode 223. The other components denoted by the same reference numerals have same functions and effects as those of the embodiment of FIG. 3, and thus detailed descriptions thereof are omitted.

Referring to FIG. 4, from among the light emission regions R1, R2, and R3 arranged in the first direction X, light emission regions adjacent to one another emit light of different colors. The light emission regions R1, R2, and R3 arranged in the second direction Y emit light of a same color. For example, all of the light emission regions in a first column may be red regions R1, all of the light emission regions in a second column may be green regions R2, and all of the light emission regions in a third column may be blue regions R3. Light emission regions on the first through third columns may be repeatedly arranged as light emission regions in fourth through sixth columns. In this case, the red regions R1, the green regions R2, and the blue regions R3 are alternately formed in light emission regions of each column.

Similar to the embodiment shown in FIG. 3, in the embodiment shown in FIG. 4, the auxiliary electrode 223 is formed in non-light emission regions to prevent a reduction of an aperture and a voltage drop of the counter electrode 222. Therefore, the auxiliary electrode 223 has a length extending in the second direction X. and the auxiliary electrode 223 has a width smaller than or equal to the interval between the light emission regions R1, R2, or R3 of a same color.

Like in FIG. 3, in FIG. 4, the substrate 1 on which the organic light emission unit 21 is arranged has long sides 1a extending in the first direction X and short sides 1b extending in the second direction Y. Therefore, the auxiliary electrode 223 is arranged to extend in a direction substantially corresponding to the direction in which the short sides 1b of the substrate 1 extend.

According to some embodiments, when the auxiliary electrode 223 that is electrically connected to the counter electrode 222 is arranged, a voltage drop that occurs when only the counter electrode 222 comprising a metal oxide or a metal thin-film is used may be prevented. Therefore, image quality and quality of an organic light-emitting display device may be improved.

In the embodiments shown in FIGS. 3 and 4, to efficiently prevent a voltage drop, terminal units 223-1 for applying power to the auxiliary electrode 223 may be arranged near to the long sides 1a in FIG. 3, whereas the terminal units 223-1 may be arranged near to the short sides 1b in FIG. 4. However, since a voltage drop is proportional to a distance, if the auxiliary electrodes 223 having a same thickness and a same width are formed, the case shown in FIG. 3, in which the terminal units 223-1 are arranged near to the long sides 1a of the substrate 1, is more effective for preventing a voltage drop.

Figure 5:
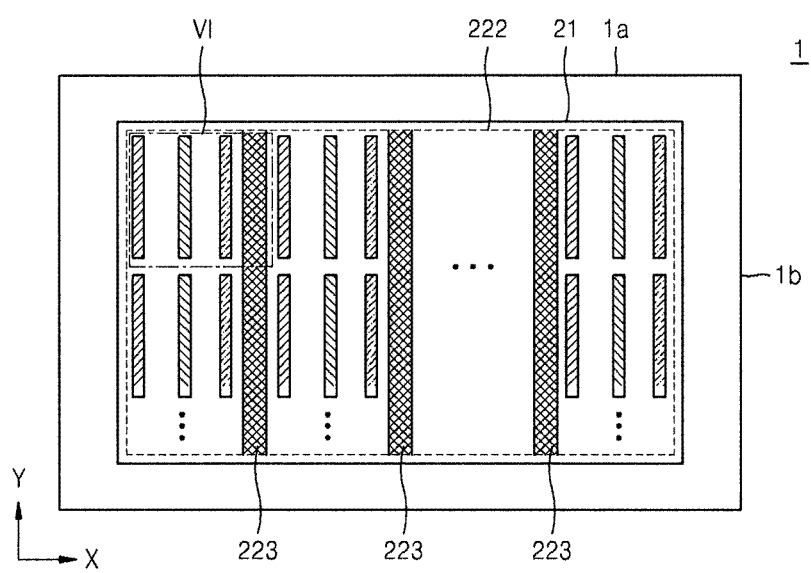
FIG. 5 shows a comparative embodiment for describing effects of some embodiments.

FIG. 5 shows a comparative embodiment for describing effects of some embodiments. Referring to FIG. 5, light emission regions adjacent to one another from among the light emission regions R1, R2, and R3 that are arranged in the first direction X emit light of a same color. In the comparative embodiment shown in FIG. 5, the auxiliary electrode 223 has a length extending in the second direction Y and that are arranged on non-light emission regions between light emission regions of different colors.

Figure 6:
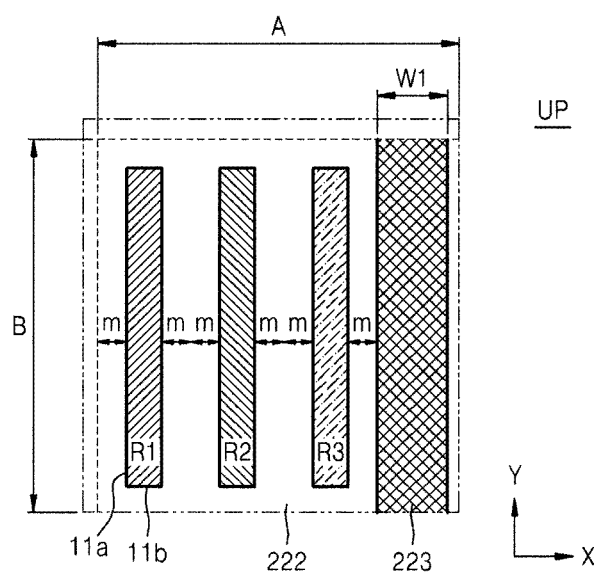
FIG. 6 is a diagram of a comparative embodiment showing one unit pixel region of FIG. 5 in closer detail.
Figure 7:
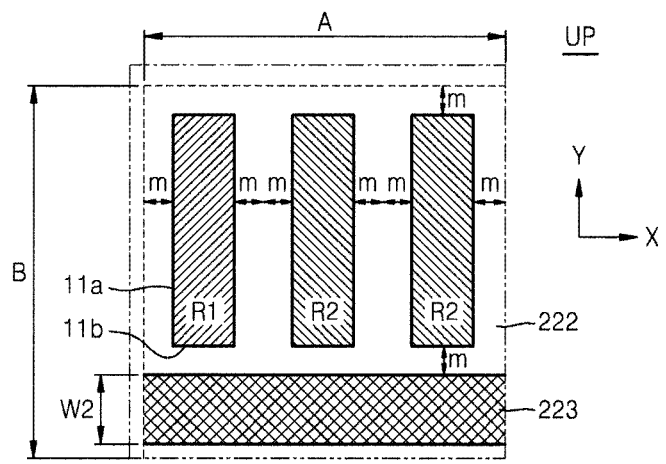
FIG. 7 is a diagram showing one unit pixel region of FIG. 4 in closer detail.

FIG. 6 is a diagram of a comparative embodiment showing one unit pixel region UP of FIG. 5 in closer detail, whereas FIG. 7 is a diagram showing one unit pixel region UP of FIG. 4 in closer detail. A drawing of one unit pixel region UP of FIG. 3 in closer detail is identical to 90 degrees rotation of the one in FIG. 7. Therefore, descriptions regarding FIG. 4 will be given below, and repeated descriptions regarding FIG. 3 are omitted.

In each of the light emission regions R1, R2, and R3, an organic light-emitting layer is deposited. Here, to reduce a shadow formed during deposition of an organic light-emitting layer on an adjacent light emission region, it is necessary to form light emission regions to be apart from one another by a predetermined interval, that is, to form process margin regions between the light emission regions. Between light emission regions adjacent to each other, process margin regions m corresponding to the respective light emission regions are formed, and thus two light emission regions are apart from each other by a distance equivalent to two process margin regions 2m. The unit pixel region UP has a constant area according to a design rule. A unit pixel region UP includes the red region R1, the green region R2, and the blue region R3, each of which includes the process margin region m, and the auxiliary electrode 223. In a case where an auxiliary electrode is patterned using an auxiliary layer described below, a process margin region corresponding to the auxiliary electrode is not necessary. However, in a case where an auxiliary electrode is patterned by using a mask, an additional process margin region corresponding to the auxiliary electrode is necessary.

In FIG. 6, the auxiliary electrode 223 extending in the second direction Y and the red region R1, the green region R2, and the blue region R3 having long sides 11a extending in the second direction Y are arranged in the unit pixel region UP. Here, each of the light emission regions R1, R2, and R3 includes a predetermined process margin region m. In FIG. 6, the auxiliary electrode 223 and the long sides 11a of the light emission regions R1, R2, and R3 extend in a same direction. In other words, it is necessary to arrange the three light emission regions R1, R2, and R3 and the auxiliary electrode 223 next to one another near to a side of the unit pixel region UP. Therefore, there is a limit in increasing a width W1 of the auxiliary electrode 223 within the unit pixel region UP.

However, according to the embodiment shown in FIG. 7, a direction in which the auxiliary electrode 223 extends and a direction in which long sides 11a of light emission regions extend cross each other in the unit pixel region UP. In other words, only the three light emission regions R1, R2, and R3 are arranged near to a side of the unit pixel region UP, whereas the auxiliary electrode 223 is arranged near to another side of the unit pixel region UP. Therefore, there is a space for increasing a width W2 of the auxiliary electrode 223. As described above, according to an embodiment, a width of the auxiliary electrode 223 may increase when reduction of an aperture ratio of an organic light-emitting display device minimize. Therefore, a voltage drop may be prevented.

Experimentally, when a dimension of the unit pixel region UP was A:630×B:630 (micrometers), a length of the short side 11b of one light emission region was 54 (micrometers), a length of the long side 11a of the light emission region was 610 (micrometers), and the maximum width W1 of the auxiliary electrode 223 corresponding to an aperture about 24.9% was only 108 (micrometers) when a width of the process margin region m of the light emission region was 60 (micrometers).

However, in the embodiment shown in FIG. 7, regarding the unit pixel region UP having the same area, a length of the short side 11b of one light emission region may be 90 (micrometers), a length of the long side 11a of the light emission region may be 366 (micrometers), and the maximum width W2 of the auxiliary electrode 223 corresponding to an aperture about 24.9% may be up to 144 (micrometers) when a width of the process margin region m of the light emission region is 60 (micrometers).

As described above, according to some embodiments, as the auxiliary electrode 223 having a sufficient width is arranged, a voltage drop of the counter electrode 222 may be reduced by about 25%, as compared to the comparative embodiment shown in FIG. 5.

Hereinafter, an embodiment in which an auxiliary layer 224 is further formed to pattern an auxiliary electrode on the counter electrode 222.

Figure 8:
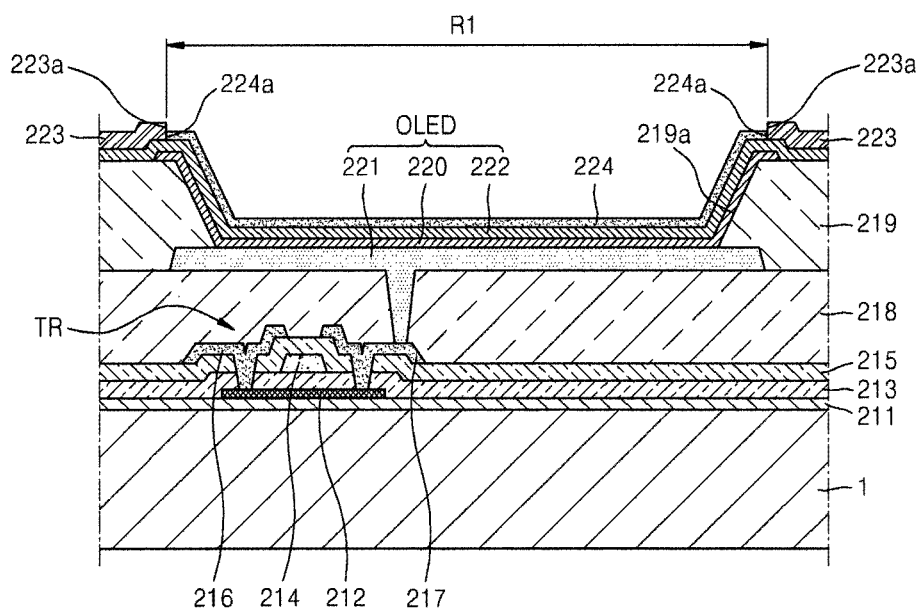
FIG. 8 shows one pixel of a light emission unit shown in FIGS. 3 and 4.

FIG. 8 shows one pixel of the light emission unit 21 shown in FIGS. 3 and 4. The light emission unit 21 may include a plurality of such pixels. Particularly, FIG. 8 is a sectional view of one pixel including the red region R1 of FIG. 3 along line VIII-VIII.

Referring to FIG. 8, a buffer layer 211 is formed on one surface of the substrate 1, and a thin film transistor (TFT) TR is formed on the buffer layer 211.

Although the embodiment of FIG. 8 includes only one TFT TR, the pixel may form a pixel circuit by having one or more TFTs and capacitors.

The buffer layer 211 functions to prevent penetration of foreign materials and to planarize a surface of the substrate 1. The buffer layer 211 may be formed by using one of various materials capable of performing the functions. For example, the buffer layer 211 may comprise an inorganic material including silicon oxide, silicon nitride, silicon oxynitride, aluminum oxide, aluminum nitride, titanium oxide, or titanium nitride, an organic material including polyimide, polyester, or acryl, or a multi-stack of these. The buffer layer 211 is not essential and thus, if not desired, the buffer layer 211 may not be formed.

A semiconductor active layer 212 is formed on the buffer layer 211. The semiconductor active layer 212 may comprise polycrystalline silicon. However, the semiconductor active layer 212 is not limited thereto, and may comprise an oxide semiconductor. For example, the semiconductor active layer 212 may include a G-I—Z—O layer [$(In_2O_3)a(Ga_2O_3)_b$ (ZnO)c layer] (where a, b, and c are whole numbers that satisfy a≥0, b≥0, and c>0, respectively).

A gate insulating layer 213 is formed on the buffer layer 211 so as to cover the semiconductor active layer 212, and a gate electrode 214 is formed on the gate insulating layer 213.

An interlayer insulating layer 215 is formed on the gate insulating layer 213 so as to cover the gate electrode 214, and a source electrode 216 and a drain electrode 217 are formed on the interlayer insulating layer 215 so as to respectively contact the semiconductor active layer 212 via contact holes.

However, a structure of the TFT TR is not limited to the above-described structure and thus the TFT TR may have one of various TFT structures. For example, though in the present embodiment the TFT TR has a top gate structure, the TFT TR may have a bottom gate structure in which the gate electrode 214 is disposed below the semiconductor active layer 212. In this regard, one of various and available TFT structures may be applied to the TFT TR.

A pixel circuit (not shown) including the TFT TR and a capacitor (not shown) may be formed.

A passivation layer 218 is formed to cover the pixel circuit including the TFT TR and the capacitor. The passivation layer 218 may be a single insulating layer or a plurality of insulating layers whose top surface is planarized. The passivation layer 218 may comprise an inorganic material and/or an organic material.

As illustrated in FIG. 8, a pixel electrode 221 that is electrically connected to the pixel circuit including the TFT TR is formed on the passivation layer 218. The pixel electrode 221 has an island form that is separate in each pixel.

A pixel-defining layer 219 is formed on the passivation layer 218 so as to cover edges of the pixel electrode 221. An opening 219a is formed in the pixel-defining layer 219 to thereby open a central portion of the pixel electrode 221 and not the edges of the pixel electrode 221.

An organic layer 220 is formed on the pixel electrode 221 exposed via the opening 219a, and a counter electrode 222 is formed to cover the organic layer 220, so that an organic light-emitting diode (OLED) is formed.

The organic layer 220 may be formed as a small-molecule organic layer or a polymer organic layer. When the organic layer 220 is formed as a small-molecule organic layer, the organic layer 220 may have a structure in which a Hole Injection Layer (HIL), a Hole Transport Layer (HTL), an emission layer (EML), an Electron Transport Layer (ETL), an Electron Injection Layer (EIL), or the like are singularly or multiply stacked. The small-molecule organic layer may be formed by vacuum deposition. Here, the EML may be independently formed in each of red, green, and blue pixels, and the HIL, the HTL, the ETL, and the EIL are common layers that may be commonly applied to the red, green, and blue pixels.

The HIL may comprise a phthalocyanine compound including copper phthalocyanine, or TCTA, m-MTDATA, m-MTDAPB, or the like, which are a starburst-type amine.

The HTL may comprise N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

The EIL may comprise lithium fluoride (LiF), sodium chloride (NaCl), caesium fluoride (CsF), lithium oxide (Li2O), barium oxide (BaO), or Liq.

The ETL may comprise aluminum tris(8-hydroxyquinoline) (Alq3).

The EML may include a host material and a dopant material.

Examples of the host material may include tris(8-hydroxyquinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene(BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

The pixel electrode 221 may function as an anode electrode, and the counter electrode 222 may function as a cathode electrode. Obviously, polarities of the pixel electrode 221 and the counter electrode 222 may be reversed.

In a case where the pixel electrode 221 functions as an anode electrode, the pixel electrode 221 may comprise a material having a high work function and may include ITO, IZO, ZnO, or $In_2O_3$. In a case where the organic light-emitting display device of FIGS. 1 and 2 is a top emission type organic light-emitting display device in which an image is realized away from the substrate 1, the pixel electrode 221 may further include a reflective layer comprising silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

In a case where the counter electrode 222 functions as a cathode electrode, the counter electrode 222 may comprise a metal material including Ag, Mg, Al, Pt, Pd, Au, Ni, Nd, Ir, Cr, Li, or Ca. In a case where the organic light-emitting display device of FIGS. 1 and 2 is a top emission type organic light-emitting display device, the counter electrode 222 needs to be light-transmissive. To do so, the counter electrode 222 may include ITO, IZO, ZnO, or $In_2O_3$, which are transparent metal oxides. Also, the counter electrode 222 may be formed as a thin film by using Al, Ag, and/or Mg. For example, the counter electrode 222 may have a structure in which an alloy of Mg and Ag and/or Ag is singularly or multiply stacked. Unlike the pixel electrode 221, the counter electrode 222 is formed to apply a common voltage to all pixels, and to do so, the counter electrode 222 is formed as a common electrode that is not patterned for each of the pixels.

As described above, in a case where the organic light-emitting display device of FIGS. 1 and 2 is a top emission type organic light-emitting display device, the counter electrode 222 includes transparent metal oxide and/or thin metal, so that, if the counter electrode 222 is formed as the common electrode, a sheet resistance of the counter electrode 222 increases and thus a voltage drop occurs. In order to solve this problem, according to the present embodiment, the auxiliary electrode 223 is further formed on the counter electrode 222 to be electrically connected to the counter electrode 222. Here, to pattern the auxiliary electrode 223, the auxiliary layer 224 is employed.

The auxiliary layer 224 is formed on a light emission region R1 of the counter electrode 222, and has first side edges 224a.

The auxiliary electrode 223 is formed on a second region R2 of the counter electrode 222, and has second side edges 223a. The auxiliary electrode 223 is in parallel with the auxiliary layer 224 and is adjacent to the auxiliary layer 224.

Side surfaces of the first side edges 224a of the auxiliary layer 224 contact side surfaces of the second side edges 223a of the auxiliary electrode 223.

In order to decrease a sheet resistance of the counter electrode 222, a thickness of the auxiliary electrode 223 may be greater than a thickness of the counter electrode 222.

Since the auxiliary layer 224 covers the region in which emission occurs in at least one pixel, the auxiliary layer 224 may be formed to be light-transmissive. The auxiliary layer 224 may be formed as a thin film whose thickness is less than the auxiliary electrode 223 but is not limited thereto.

In the present embodiment, adhesion between the auxiliary electrode 223 and the auxiliary layer 224 may be less than adhesion between the auxiliary electrode 223 and the counter electrode 222.

To do so, the auxiliary layer 224 may comprise an organic materials, such as 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), 2-(4-(9,10-di(naphthalene-2-yl)anthracene-2-yl)phenyl)-1-phenyl-1H-benzo-[D]imidazole (LG201), or the like.

The auxiliary electrode 223 may include Mg.

Since the auxiliary electrode 223 and the counter electrode 222 include Mg, they have excellent adhesion. However, Mg is not bonded well to the above-described material that forms the auxiliary layer 224. Thus, by using adhesion characteristics between the auxiliary electrode 223 and the auxiliary layer 224, the auxiliary electrode 223 may be easily patterned.

According to the present embodiment, the auxiliary electrode 223 may be easily patterned by using the adhesion characteristics between the auxiliary electrode 223 and the auxiliary layer 224. Hereinafter, this patterning method is described in detail.

Figure 9:
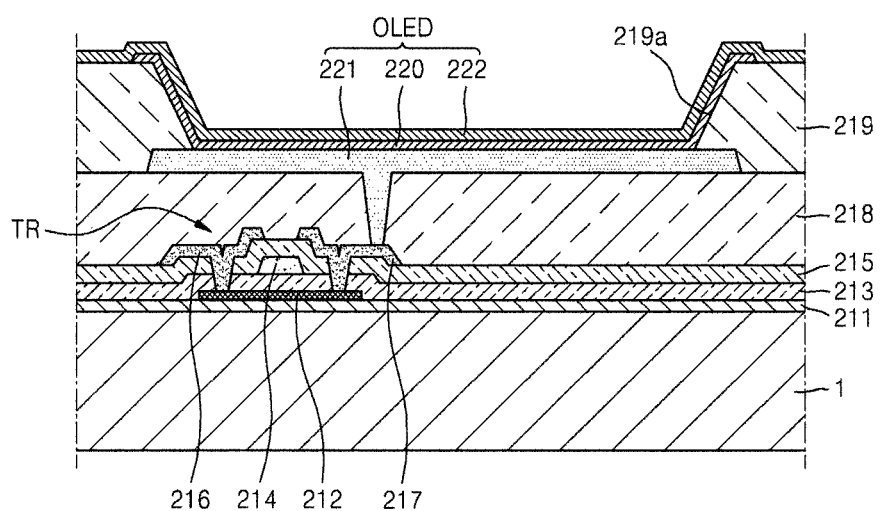
FIGS. 9 through 11 are diagrams showing a method of patterning an auxiliary electrode by using an auxiliary layer, according to an embodiment.
Figure 10:
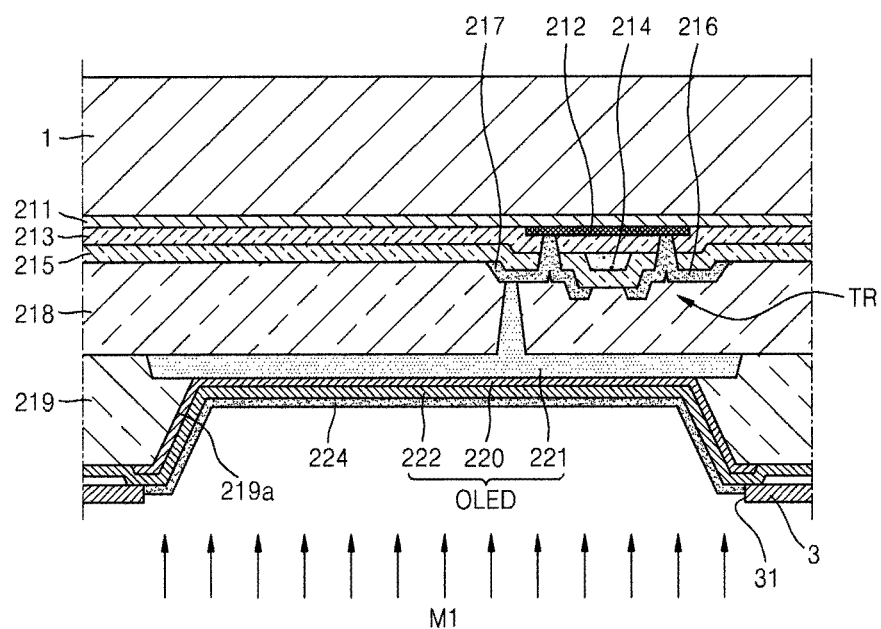
Figure 11:
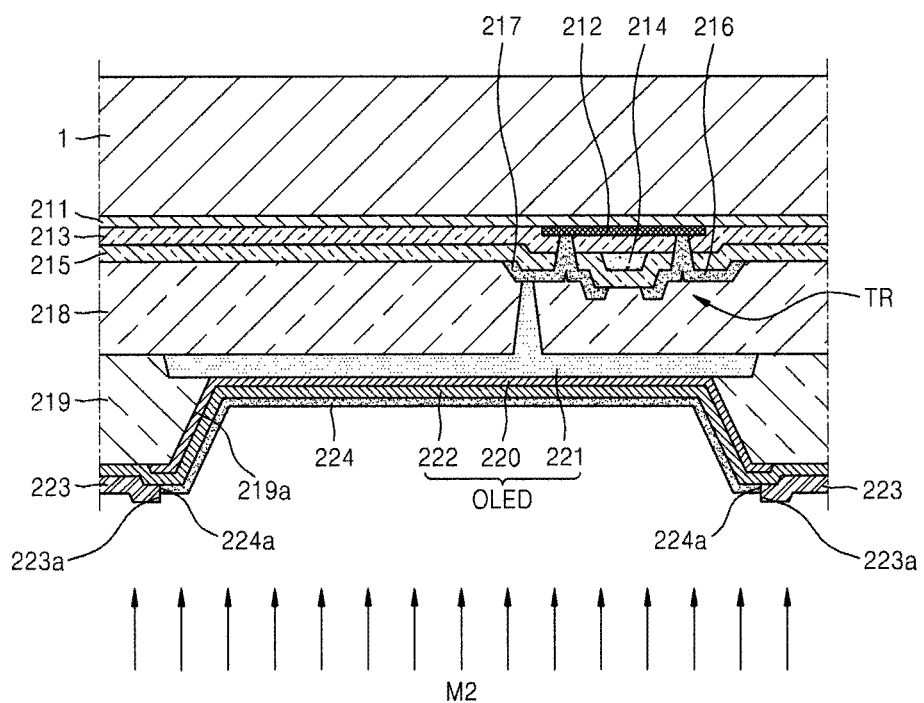

FIGS. 9 through 11 are diagrams showing a method of patterning the auxiliary electrode 223 by using the auxiliary layer 224, according to an embodiment.

First, as illustrated in FIG. 9, after the counter electrode 222 is formed, and, as illustrated in FIG. 10, the auxiliary layer 224 is formed by using a mask 3. The auxiliary layer 224 may be formed by using the above-described organic material, so that the auxiliary layer 224 may be formed by a thermal evaporation method using the mask 3. An opening 31 is formed in the mask 3 to correspond to a pattern of the auxiliary layer 224, and a material M1 for forming the auxiliary layer 224 is deposited via the opening 31, so that the auxiliary layer 224 is formed on the counter electrode 222.

Next, as illustrated in FIG. 11, a material M2 for forming the auxiliary electrode 223 is completely formed. Although not illustrated, the material M2 may be formed by using an open mask that exposes all pixels or may be formed without a mask.

In this case, the material M2 for forming the auxiliary electrode 223 is not formed on the auxiliary layer 224 due to weak adhesion between the material M2 and the auxiliary layer 224, and is formed only on the counter electrode 222 having a relatively great adhesion with the material M2.

Thus, the auxiliary electrode 223 may be naturally patterned without a separate mask or a separate patterning process.

Figure 12:
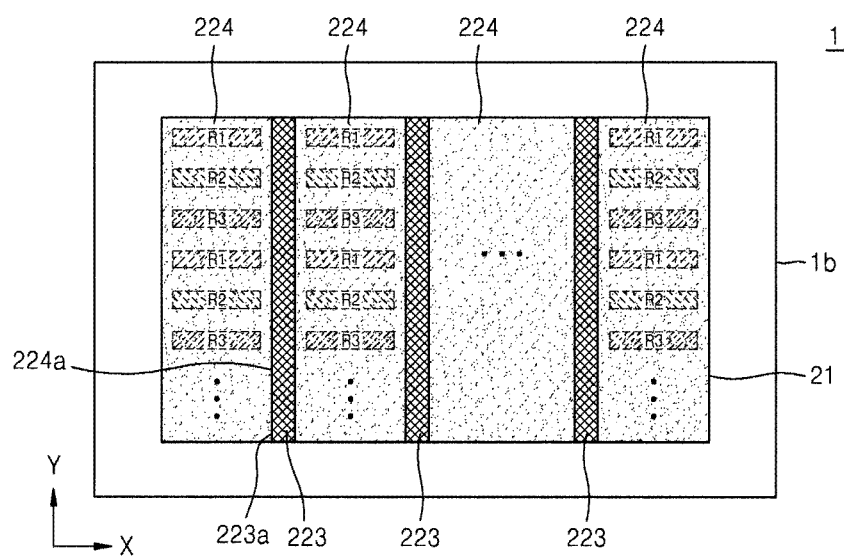
FIGS. 12 and 13 shows that the auxiliary layer has a stripe form so as to cover a plurality of pixels that are disposed in series.
Figure 13:
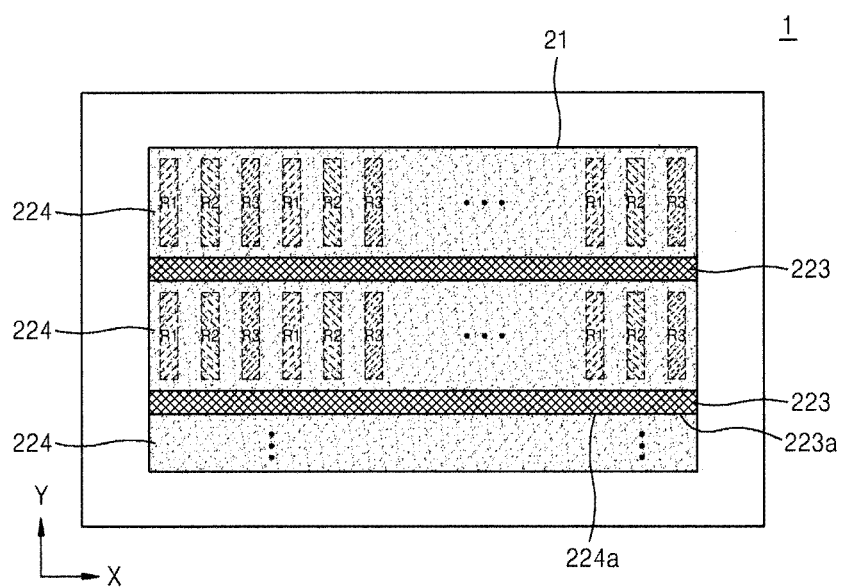

In FIGS. 12 and 13, the auxiliary layer 224 has a stripe form so as to cover a plurality of pixels P that are disposed in series. Here, the auxiliary layer 224 may be arranged to cover a plurality of light emission regions and process margin regions thereof. Therefore, in this case, the auxiliary electrode 223 forms a stripe pattern covering non-light emission regions.

Figure 14:
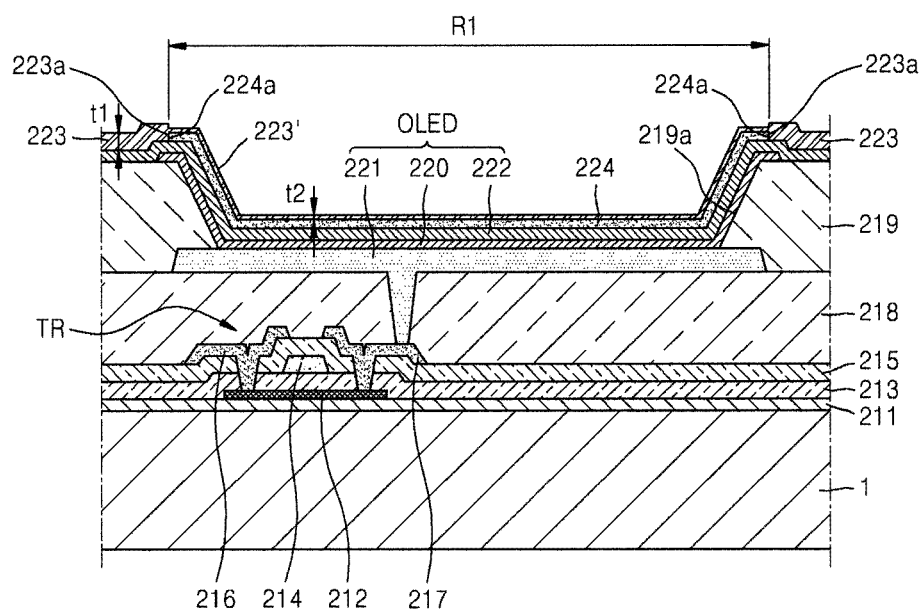
FIG. 14 shows a modification of the embodiment shown in FIG. 8.

When the material M2 for forming the auxiliary electrode 223 is deposited, as shown in FIG. 11, the auxiliary electrode 223 is formed on a region except for the auxiliary layer 224 but also, as illustrated in FIG. 14, a thin film 223' having a second thickness t2 that is less than a first thickness t1 of the auxiliary electrode 223 formed on the region except for the auxiliary layer 224 may be formed on the auxiliary layer 224. In this regard, theoretically, the material M2 for forming the auxiliary electrode 223 has weak adhesion with the auxiliary layer 224 so that the material M2 is not formed on the auxiliary layer 224 and is formed only on the counter electrode 222 having great adhesion with the material M2. Thus, actually, when deposition is performed by using the open mask, without a separate patterning mask, as illustrated in FIG. 11, the thin film 223' having the second thickness t2 may be thinly formed on the auxiliary layer 224.

Since the second thickness t2 is less than the first thickness t1, the second thickness t2 may not significantly affect the brightness of an organic EL device in the light emission region R1.

Figure 15:
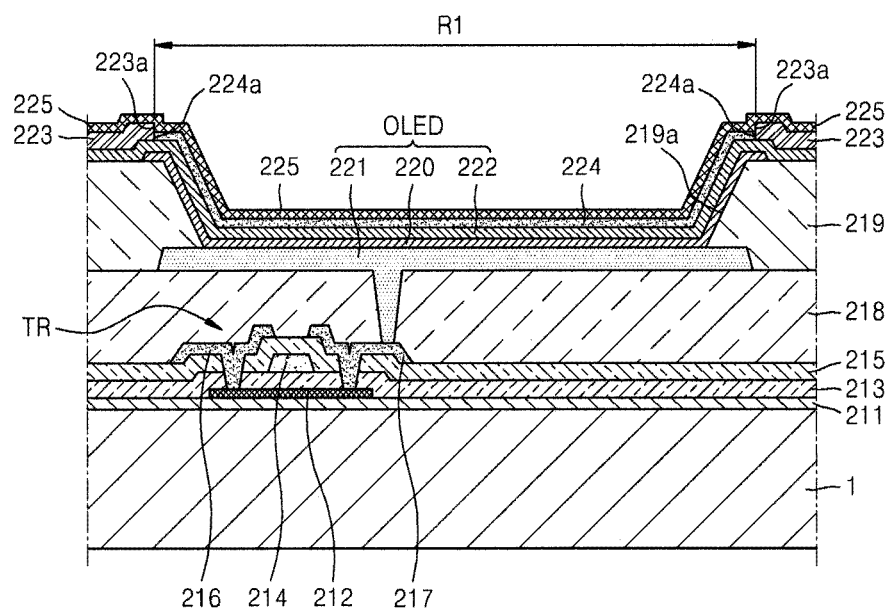
FIG. 15 shows a modification of the embodiment shown in FIG. 8.

The top surface of the organic light emission unit 21 may be damaged by the sealing substrate 23 of FIG. 1. Furthermore, in a case where the sealing film 26 is formed as shown in FIG. 2, the top surface of the organic light emission unit 21 may be easily damaged during the formation of the sealing film 26. To resolve this problem, referring to FIG. 15, a capping layer 225 may be further formed to cover the auxiliary electrode 223 and the auxiliary layer 224.

Figure 16:
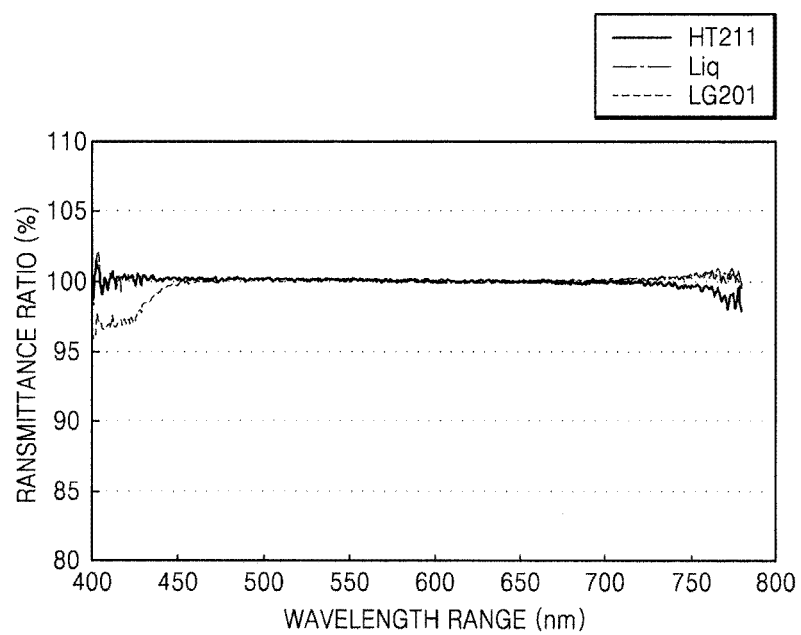
FIG. 16 is a graph that shows light transmittance ratio in a pixel light emission region when the auxiliary layer and the auxiliary electrode are formed by using the method shown in FIGS. 9 through 11.

Here, since the capping layer 225 covers light emission regions, the capping layer 225 comprises a phototransmissive material. Since no particular pattern is necessary in a pixel, the capping layer 225 may be formed by using an open mask that exposes all pixels or may comprise a capping layer forming material via a thermal evaporation method without a mask. FIG. 16 is a graph that shows light transmittance ratio in a pixel light emission region when the auxiliary layer 224 and the auxiliary electrode 223 are formed by using the method shown in FIGS. 9 through 11.

The auxiliary layer 224 was formed of the above-described capping layer material and was deposited with a thickness of 30 Å. The auxiliary electrode 223 was formed by depositing Mg on an entire pixel region by using an open mask, and in this regard, 1000 Å of Mg was deposited.

As illustrated in FIG. 16, it can be seen that almost 100% transmittance is shown in an entire wavelength range of visible light. This means that, as described above, Mg was hardly deposited on a region where the auxiliary layer 224 was formed.

Thus, according to the one or more embodiments, the auxiliary layer 224 and the auxiliary electrode 223 may be effectively formed without light loss.

Figure 17:
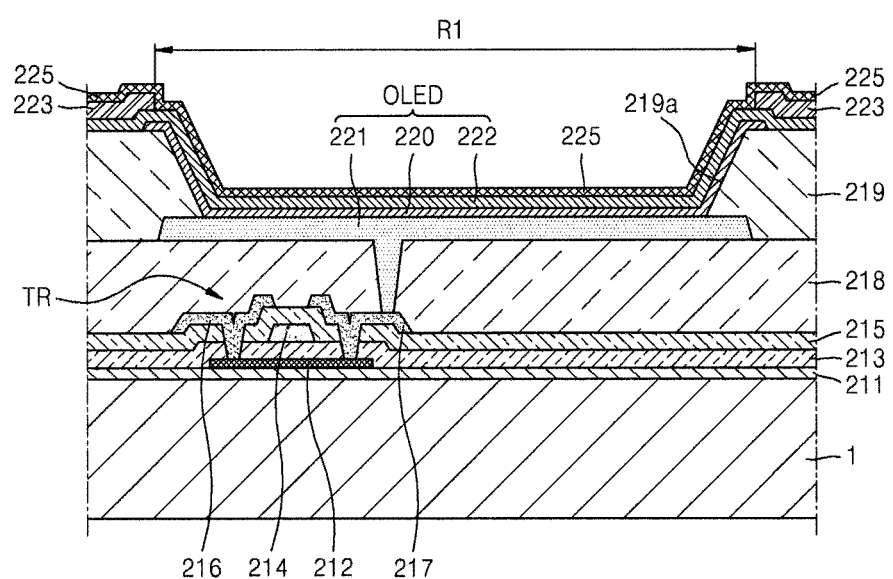
FIG. 17 is a sectional view of the organic light emission unit according to another embodiment.

FIG. 17 is a sectional view of the organic light emission unit 21 according to another embodiment. The embodiment shown in FIG. 17 differs from the embodiment shown in FIG. 8 in terms of a method of forming the auxiliary electrode 223.

In detail, referring to FIG. 17, the auxiliary electrode 223 is formed in a non-light emission region without using the auxiliary layer 224 of FIG. 8.

Hereinafter, a method of fabricating the structure shown in FIG. 17 will be described.

First, as shown in FIG. 9, after the counter electrode 222 is formed, the auxiliary electrode 223 is formed on the counter electrode 222 in the non-light emission region. The auxiliary electrode 223 may be patterned via a process widely used for patterning a common metal film, e.g., photolithography, or via a process, such as sputtering.

Here, the auxiliary electrode 223 may comprise Al, Mg, or Ag. Unlike in FIGS. 8 through 11, since the auxiliary electrode 223 is not patterned by using the auxiliary layer 224, materials for forming the auxiliary electrode 223 are not limited, and any of various metals with low resistances other than Al and Ag may be used.

Next, after the auxiliary electrode 223 is formed, the capping layer 225 is formed on the counter electrode 222 to completely cover the auxiliary electrode 223.

Since the capping layer 225 covers light emission regions, the capping layer 225 is formed to be phototransmissive. Since no particular pattern is necessary in a pixel, the capping layer 225 may be formed by using an open mask that exposes all pixels or may comprise a capping layer forming material via a thermal evaporation method without a mask Since the capping layer 225 is formed to cover both the counter electrode 222 and the auxiliary electrode 223 in the light emission region R1, the structure shown in FIG. 17 may prevent the counter electrode 222 and the auxiliary electrode 223 from being damaged by the sealing substrate 23 of FIG. 1 or the sealing film 26 of FIG. 2.

Although the above descriptions are given in relation to a top emission type display device, the present embodiments are not limited thereto and may also apply to a dual emission type display device in which images are embodied in two opposite directions relative to the substrate 1.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A display device comprising:
a substrate;
an organic light emission unit comprising light emission regions arranged on the substrate, wherein light emission regions arranged in a first direction emit light of a same color and light emission regions adjacent to one another from among light emission regions arranged in a second direction crossing the first direction emit light of different colors;
a counter electrode, arranged to cover at least the light emission regions; and
an auxiliary electrode, on the counter electrode,
wherein the auxiliary electrode does not overlap the light emission regions, extends in the second direction;
an auxiliary layer formed in at least one of the light emission regions.

2. The display device of claim 1, further comprising non-light emission regions that are arranged between the light emission regions arranged in the first direction, and wherein the auxiliary electrode is arranged in at least one of the non-light emission regions.

3. The display device of claim 1, wherein the substrate comprises
- long sides extending in the first direction and short sides extending in the second direction, and
- the auxiliary electrode extends in the direction in which the short sides extend.

4. The display device of claim 3, wherein a terminal for applying power to the auxiliary electrode is arranged near at least one of the long sides.

5. The display device of claim 1, wherein the substrate comprises
- long sides extending in the second direction and short sides extending in the first direction, and
- the auxiliary electrode extends in the direction in which the long sides extend.

6. The display device of claim 5, wherein a terminal for applying power to the auxiliary electrode is arranged near at least one of the short sides.

7. The display device of claim 1, wherein first sides of the light emission regions extending in the first direction are longer than second sides of the light emission regions extending in the second direction.

8. The display device of claim 1, wherein the counter electrode is arranged to be phototransmissive.

9. The display device of claim 1, wherein the auxiliary electrode comprises a metal with a low resistance.

10. The display device of claim 1, wherein the auxiliary layer is arranged to be phototransmissive.

11. The display device of claim 1, wherein
- the auxiliary layer has first side edges, and
- the auxiliary electrode has second side edges of which side surfaces contact side surfaces of the first side edges.

12. The display device of claim 11, wherein adhesion between the auxiliary electrode and the auxiliary layer is weaker than adhesion between the auxiliary electrode and the counter electrode.

13. The display device of claim 11, wherein the auxiliary electrode comprises Mg or Mg alloy.

14. The display device of claim 1, wherein the auxiliary layer comprises 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

15. The display device of claim 1, wherein a first electrode is formed in correspondence to at least one of the light emission regions, further comprising a thin-film transistor (TFT) electrically connected to the first electrode.

16. An organic light-emitting display device comprising:
a substrate, which comprises:
- a first region; and
- second regions, which are arranged by interposing the first region therebetween and emit light of a same color;

first electrodes arranged in the second regions;
second electrodes, which face the first electrodes and are arranged to cover the first region and the second regions;
organic light-emitting layers which are interposed between the first electrode and the second electrodes and emit light;
a third electrode, which contacts at least one of the second electrodes and is arranged in the first region; and
an organic layer formed at least on the second electrodes in the second regions.

17. The organic light-emitting display device of claim 16, wherein
- the substrate comprises long sides extending in a first direction and short sides extending in a second direction, and
- the third electrode extends in the direction in which the short sides extend.

18. The organic light-emitting display device of claim 16, wherein
- the substrate comprises long sides extending in a second direction and short sides extending in a first direction, and
- the third electrode extends in the direction in which the long sides extend.

19. The organic light-emitting display device of claim 16, wherein at least one of the second electrodes is formed to be phototransmissive.

20. The organic light-emitting display device of claim 16, wherein the third electrode comprises a metal with a low resistance.

21. The organic light-emitting display device of claim 16, wherein the organic layer is arranged to be phototransmissive.

22. The organic light-emitting display device of claim 16, wherein
- the organic layer has first side edges, and
- the third electrode has second side edges of which side surfaces contact side surfaces of the first side edges.

23. The organic light-emitting display device of claim 22, wherein adhesion between the third electrode and the organic layer is weaker than adhesion between the third electrode and the second electrode.

* * * * *